(12) United States Patent
Maxim et al.

(10) Patent No.: US 9,973,154 B2
(45) Date of Patent: May 15, 2018

(54) DUAL OUTPUT RF LNA

(71) Applicant: Qorvo US, Inc., Greensboro, NC (US)

(72) Inventors: George Maxim, Saratoga, CA (US); Marcus Granger-Jones, Scotts Valley, CA (US); Kelvin Kai Tuan Yan, Oak Ridge, NC (US); Dirk Robert Walter Leipold, San Jose, CA (US); Baker Scott, San Jose, CA (US)

(73) Assignee: Qorvo US, Inc., Greensboro, NC (US)

(*) Notice: Subject to any disclaimer, the term of this patent is extended or adjusted under 35 U.S.C. 154(b) by 0 days. days.

(21) Appl. No.: 15/467,829

(22) Filed: Mar. 23, 2017

(65) Prior Publication Data

US 2017/0279416 A1    Sep. 28, 2017

Related U.S. Application Data

(60) Provisional application No. 62/311,994, filed on Mar. 23, 2016.

(51) Int. Cl.
*H03F 3/04* (2006.01)
*H03F 1/56* (2006.01)
*H04B 1/10* (2006.01)
*H04B 1/18* (2006.01)
*H03F 3/19* (2006.01)
(Continued)

(52) U.S. Cl.
CPC ............. *H03F 1/56* (2013.01); *H03F 1/0266* (2013.01); *H03F 1/223* (2013.01); *H03F 3/19* (2013.01); *H03F 3/72* (2013.01); *H04B 1/109* (2013.01); *H04B 1/18* (2013.01); *H03F 2200/111* (2013.01); *H03F 2200/18* (2013.01); *H03F 2200/222* (2013.01); *H03F 2200/27* (2013.01); *H03F 2200/294* (2013.01); *H03F 2200/387* (2013.01); *H03F 2200/451* (2013.01); *H03F 2203/7206* (2013.01); *H03F 2203/7209* (2013.01); *H03F 2203/7215* (2013.01); *H03F 2203/7221* (2013.01); *H03F 2203/7236* (2013.01)

(58) Field of Classification Search
CPC  H03F 3/04; H03F 3/20; H03F 1/0288; H03G 3/30
USPC ............................. 330/296, 285, 295, 124 R
See application file for complete search history.

(56) References Cited

U.S. PATENT DOCUMENTS 7,701,515 B2 *   4/2010   Gomez .................... H04N 5/46
                                                  348/731
9,413,306 B2 *   8/2016   Moreau ................. H03F 3/211
(Continued)

*Primary Examiner* — Henry Choe
(74) *Attorney, Agent, or Firm* — Withrow & Terranova, P.L.L.C.

(57) ABSTRACT

RF receive circuitry, which includes a first output impedance matching circuit coupled to a first alpha output of a first alpha LNA, a second output impedance matching circuit coupled to a first beta output of a first beta LNA, and a first dual output RF LNA, is disclosed. The first dual output RF LNA includes the first alpha LNA, the first beta LNA, and a first gate bias control circuit, which is coupled between a first alpha input of the first alpha LNA and ground; is further coupled between a first beta input of the first beta LNA and the ground; is configured to select one of enabled and disabled of the first alpha LNA using an alpha bias signal via the first alpha input; and is further configured to select one of enabled and disabled of the first beta LNA using a beta bias signal via the first beta input.

20 Claims, 11 Drawing Sheets

(51) Int. Cl.
*H03F 1/02* (2006.01)
*H03F 1/22* (2006.01)
*H03F 3/72* (2006.01)

(56) References Cited

U.S. PATENT DOCUMENTS

2014/0354355 A1* 12/2014 Moreau .................. H03F 3/211
                                                            330/124 R
2016/0241208 A1*  8/2016 Lehtola .................. H03F 1/565

* cited by examiner

DUAL OUTPUT RF LNA

RELATED APPLICATIONS

This application claims the benefit of provisional patent application Ser. No. 62/311,994, filed Mar. 23, 2016, the disclosure of which is hereby incorporated herein by reference in its entirety.

FIELD OF THE DISCLOSURE

Embodiments of the present disclosure relate to radio frequency (RF) low noise amplifier (LNA)s and RF power splitters, both of which may be used in RF communications systems.

BACKGROUND

As wireless communications technologies evolve, wireless communications systems become increasingly sophisticated. As such, wireless communications systems and protocols continue to expand and change to take advantage of the technological evolution. As a result, to maximize flexibility, many wireless communications devices must be capable of supporting any number of wireless communications protocols communicating using multiple RF communications bands. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

RF receive circuitry, which includes a first output impedance matching circuit coupled to a first alpha output of a first alpha LNA, a second output impedance matching circuit coupled to a first beta output of a first beta LNA, and a first dual output RF LNA, is disclosed according to one embodiment of the present disclosure. The first dual output RF LNA includes the first alpha LNA, the first beta LNA, and a first gate bias control circuit, which is coupled between a first alpha input of the first alpha LNA and ground; is further coupled between a first beta input of the first beta LNA and the ground; is configured to select one of enabled and disabled of the first alpha LNA using an alpha bias signal via the first alpha input; and is further configured to select one of enabled and disabled of the first beta LNA using a beta bias signal via the first beta input.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
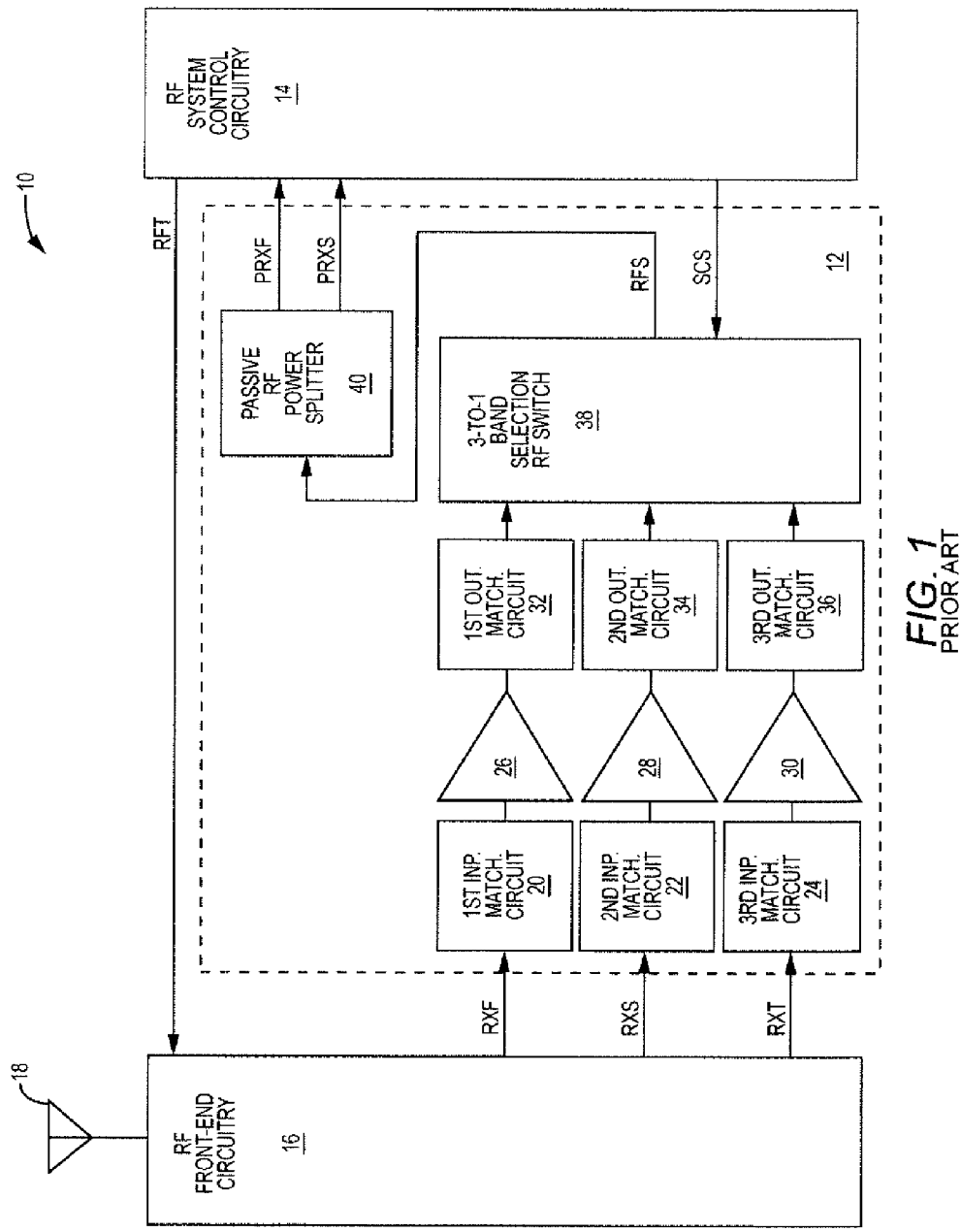
FIG. 1 shows details of RF circuitry according to the prior art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Further, it will be understood that when a circuit presents an "open circuit" at a node or output, there is not an active device, such as a transistor element, driving the node or output. However, a passive device, such as a resistive element, may be continuously coupled to the node or output.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

RF receive circuitry, which includes a first output impedance matching circuit, a second output impedance matching circuit, and a first dual output RF LNA, is disclosed according to one embodiment of the present disclosure. The first output impedance matching circuit is coupled to a first alpha output of a first alpha LNA. The second output impedance matching circuit is coupled to a first beta output of a first beta LNA. The first dual output RF LNA includes the first alpha LNA, the first beta LNA, and a first gate bias control circuit. The first gate bias control circuit is coupled between a first alpha input of the first alpha LNA and ground. The first gate bias control circuit is further coupled between a first beta input of the first beta LNA and the ground. The first gate bias control circuit selects one of enabled and disabled of the first alpha LNA using an alpha bias signal via the first alpha input. The first gate bias control circuit further selects one of enabled and disabled of the first beta LNA using a beta bias signal via the first beta input.

FIG. 1 shows details of RF circuitry 10 according to the prior art. The RF circuitry 10 includes RF receive circuitry 12, RF system control circuitry 14, RF front-end circuitry 16, and an RF antenna 18. The RF receive circuitry 12 includes a first input impedance matching circuit 20, a second input impedance matching circuit 22, a third input impedance matching circuit 24, a first RF LNA 26, a second RF LNA 28, a third RF LNA 30, a first output impedance matching circuit 32, a second output impedance matching circuit 34, a third output impedance matching circuit 36, a 3-to-1 band selection RF switch 38, and a passive RF power splitter 40.

The first RF LNA 26 is coupled between the first input impedance matching circuit 20 and the first output impedance matching circuit 32. The second RF LNA 28 is coupled between the second input impedance matching circuit 22 and the second output impedance matching circuit 34. The third RF LNA 30 is coupled between the third input impedance matching circuit 24 and the third output impedance matching circuit 36.

The first input impedance matching circuit 20 provides at least a partial impedance match between the RF front-end circuitry 16 and the first RF LNA 26. The second input impedance matching circuit 22 provides at least a partial impedance match between the RF front-end circuitry 16 and the second RF LNA 28. The third input impedance matching circuit 24 provides at least a partial impedance match between the RF front-end circuitry 16 and the third RF LNA 30. The first output impedance matching circuit 32 provides at least a partial impedance match between the first RF LNA 26 and the 3-to-1 band selection RF switch 38. The second output impedance matching circuit 34 provides at least a partial impedance match between the second RF LNA 28 and the 3-to-1 band selection RF switch 38. The third output impedance matching circuit 36 provides at least a partial impedance match between the third RF LNA 30 and the 3-to-1 band selection RF switch 38.

In one embodiment of the RF circuitry 10, the RF front-end circuitry 16 receives via the RF antenna 18 and forwards a first RF receive signal RXF to the first RF LNA 26 using the first input impedance matching circuit 20. The RF front-end circuitry 16 receives via the RF antenna 18 and forwards a second RF receive signal RXS to the second RF LNA 28 using the second input impedance matching circuit 22. The RF front-end circuitry 16 receives via the RF antenna 18 and forwards a third RF receive signal RXT to the third RF LNA 30 using the third input impedance matching circuit 24.

In one embodiment of the RF circuitry 10, the first RF LNA 26 amplifies the forwarded first RF receive signal RXF to provide a first amplified RF signal to the 3-to-1 band selection RF switch 38 via the first output impedance matching circuit 32. The second RF LNA 28 amplifies the forwarded second RF receive signal RXS to provide a second amplified RF signal to the 3-to-1 band selection RF switch 38 via the second output impedance matching circuit 34. The third RF LNA 30 amplifies the forwarded third RF receive signal RXT to provide a third amplified RF signal to the 3-to-1 band selection RF switch 38 via the third output impedance matching circuit 36.

The 3-to-1 band selection RF switch 38 couples a selected one of the first output impedance matching circuit 32, the second output impedance matching circuit 34, and the third output impedance matching circuit 36 to the passive RF power splitter 40 based on an RF switch control signal SCS. In general, the RF receive circuitry 12 includes a group of output impedance matching circuits 32, 34, 36. As such, the RF system control circuitry 14 selects the selected one of the group of output impedance matching circuits 32, 34, 36 using the RF switch control signal SCS.

The 3-to-1 band selection RF switch 38 provides an RF switch output signal RFS to the passive RF power splitter 40 based on the selected one of the group of output impedance matching circuits 32, 34, 36. The passive RF power splitter 40 receives and splits the RF switch output signal RFS to provide a first split RF receive signal PRXF and a second split RF receive signal PRXS to the RF system control circuitry 14.

The passive RF power splitter 40 may have certain limitations. Since the passive RF power splitter 40 is a passive device, an energy of the RF switch output signal RFS is divided to provide the first split RF receive signal PRXF and the second split RF receive signal PRXS. Further, in some embodiments of the passive RF power splitter 40, an unacceptably high portion of the energy of the RF switch output signal RFS may be lost. Additionally, the passive RF power splitter 40 may be physically large, particularly if a frequency of the RF switch output signal RFS is relatively low. In a conventional passive RF power splitter 40, a magnitude of the first split RF receive signal PRXF is about equal to a magnitude of the second split RF receive signal PRXS. However, if the magnitude of the first split RF receive signal PRXF needs to be different from the magnitude of the second split RF receive signal PRXS, the passive RF power splitter 40 may be unsuitable.

Figure 2:
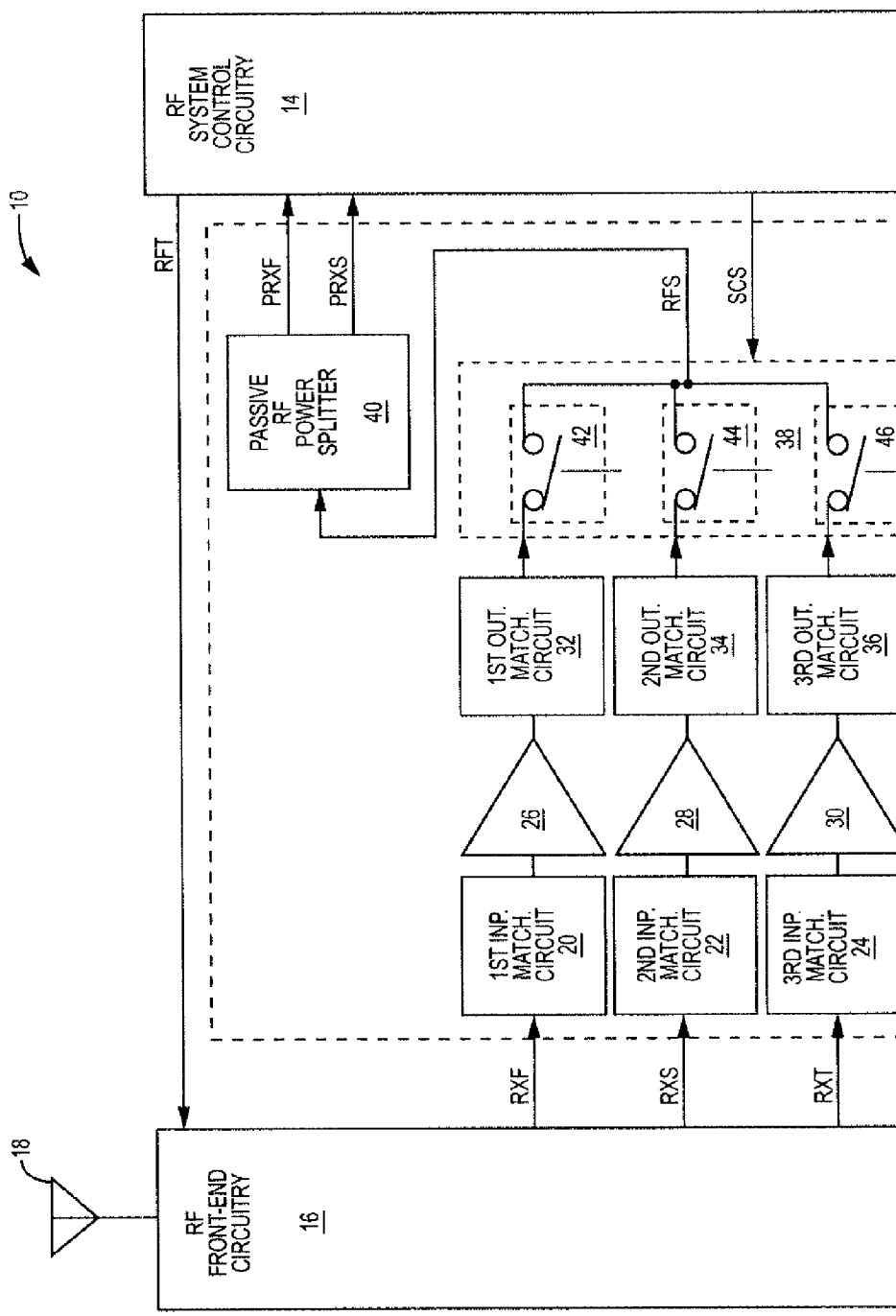
FIG. 2 shows alternate details of RF circuitry according to the prior art.

FIG. 2 shows alternate details of RF circuitry 10 according to the prior art. The RF circuitry 10 illustrated in FIG. 2 is similar to the RF circuitry 10 illustrated in FIG. 1, except the RF circuitry 10 illustrated in FIG. 2 shows details of the 3-to-1 band selection RF switch 38. The 3-to-1 band selection RF switch 38 includes a first RF switch 42, a second RF switch 44, and a third RF switch 46. The first RF switch 42 is coupled between the first output impedance matching circuit 32 and the passive RF power splitter 40. The second RF switch 44 is coupled between the second output impedance matching circuit 34 and the passive RF power splitter 40. The third RF switch 46 is coupled between the third output impedance matching circuit 36 and the passive RF power splitter 40.

In general, the RF receive circuitry 12 includes the group of output impedance matching circuits 32, 34, 36 and the 3-to-1 band selection RF switch 38 includes a group of RF switches 42, 44, 46, such that each of the group of RF switches 42, 44, 46 is coupled between a corresponding one of the group of output impedance matching circuits 32, 34, 36 and the passive RF power splitter 40. In normal operation, one of the group of RF switches 42, 44, 46 is ON and a balance of the group of RF switches 42, 44, 46 is OFF, such that the selected one of the group of output impedance matching circuits 32, 34, 36 is coupled to the passive RF power splitter 40 via the one of the group of RF switches 42, 44, 46 that is ON.

Figure 3:
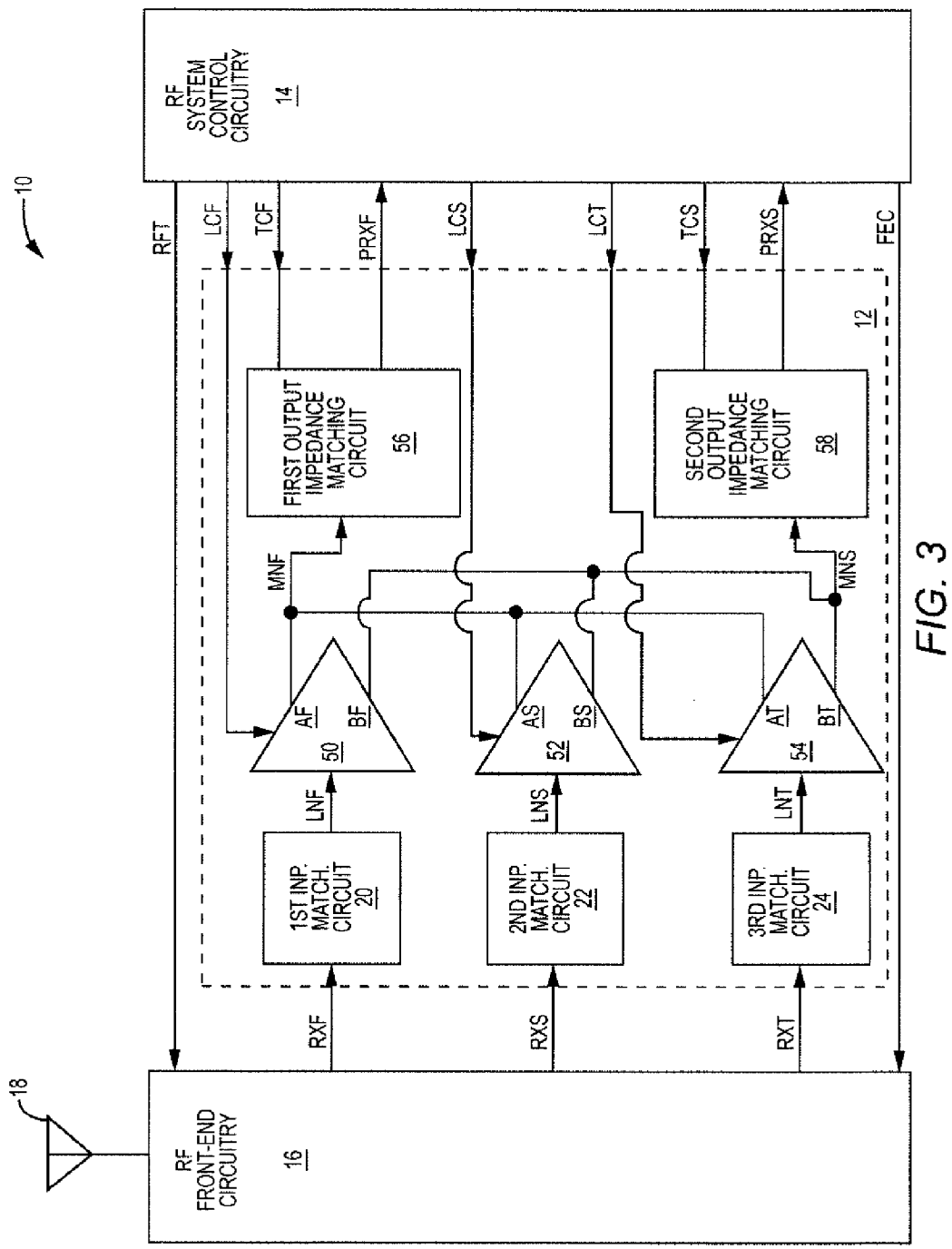
FIG. 3 shows details of RF circuitry according to one embodiment of the RF circuitry.

FIG. 3 shows details of RF circuitry 10 according to one embodiment of the RF circuitry 10. The RF circuitry 10 includes RF receive circuitry 12, RF system control circuitry 14, RF front-end circuitry 16, and an RF antenna 18. The RF receive circuitry 12 includes a first input impedance matching circuit 20, a second input impedance matching circuit 22, a third input impedance matching circuit 24, a first dual output RF LNA 50, a second dual output RF LNA 52, a third dual output RF LNA 54, a first output impedance matching circuit 56, and a second output impedance matching circuit 58.

In one embodiment of the RF circuitry 10, the RF system control circuitry 14 provides an RF transmit signal RFT to the RF front-end circuitry 16, which processes the RF transmit signal RFT for transmission via the RF antenna 18. In one embodiment of the RF circuitry 10, the RF system control circuitry 14 configures the first dual output RF LNA 50 using a first LNA configuration signal LCF, the second dual output RF LNA 52 using a second LNA configuration signal LCS, the third dual output RF LNA 54 using a third LNA configuration signal LCT, the first output impedance matching circuit 56 using a first matching circuit configuration signal TCF, the second output impedance matching circuit 58 using a second matching circuit configuration signal TCS, or any combination thereof.

The first input impedance matching circuit 20 is coupled between the RF front-end circuitry 16 and the first dual output RF LNA 50. The second input impedance matching circuit 22 is coupled between the RF front-end circuitry 16 and the second dual output RF LNA 52. The third input impedance matching circuit 24 is coupled between the RF front-end circuitry 16 and the third dual output RF LNA 54.

The first dual output RF LNA 50 has a first alpha output AF and a first beta output BF. The second dual output RF LNA 52 has a second alpha output AS and a second beta output BS. The third dual output RF LNA 54 has a third alpha output AT and a third beta output BT. The first alpha output AF is coupled to the second alpha output AS. The first alpha output AF is coupled to the third alpha output AT. The first beta output BF is coupled to the second beta output BS. The first beta output BF is coupled to the third beta output BT. In addition, the first alpha output AF is coupled to the first output impedance matching circuit 56 and the first beta output BF is coupled to the second output impedance matching circuit 58.

In one embodiment of the RF receive circuitry 12, the first alpha output AF is directly coupled to the second alpha output AS, the first alpha output AF is directly coupled to the third alpha output AT, and the first alpha output AF is directly coupled to the first output impedance matching circuit 56. In one embodiment of the RF receive circuitry 12, the first beta output BF is directly coupled to the second beta output BS, the first beta output BF is directly coupled to the third beta output BT, and the first beta output BF is directly coupled to the second output impedance matching circuit 58.

In one embodiment of the first output impedance matching circuit 56, an impedance of the first output impedance matching circuit 56 is tunable, such that the RF system control circuitry 14 tunes the impedance of the first output impedance matching circuit 56 using a first matching circuit configuration signal TCF. In one embodiment of the second output impedance matching circuit 58, an impedance of the second output impedance matching circuit 58 is tunable, such that the RF system control circuitry 14 tunes the impedance of the second output impedance matching circuit 58 using a second matching circuit configuration signal TCS.

The first input impedance matching circuit 20 provides at least a partial impedance match between the RF front-end circuitry 16 and the first dual output RF LNA 50. The second input impedance matching circuit 22 provides at least a partial impedance match between the RF front-end circuitry 16 and the second dual output RF LNA 52. The third input impedance matching circuit 24 provides at least a partial impedance match between the RF front-end circuitry 16 and the third dual output RF LNA 54.

In one embodiment of the RF circuitry 10, any or all of the RF receive circuitry 12, the RF system control circuitry 14, the RF front-end circuitry 16, and the RF antenna 18 operate in a group of operating modes. In one embodiment of the RF system control circuitry 14, the RF system control circuitry 14 selects one of the group of operating modes.

During a first operating mode of the group of operating modes, the RF front-end circuitry 16 receives and processes an RF signal via the RF antenna 18 to provide a first RF receive signal RXF to the first input impedance matching circuit 20, which forwards the first RF receive signal RXF to provide a first LNA input signal LNF to the first dual output RF LNA 50, which receives and amplifies the first LNA input signal LNF to provide a first impedance matching input signal MNF to the first output impedance matching circuit 56 via the first alpha output AF.

During the first operating mode, the first output impedance matching circuit 56 provides at least a partial impedance match between the first dual output RF LNA 50 and the RF system control circuitry 14, and forwards the first impedance matching input signal MNF to provide a first split RF receive signal PRXF to the RF system control circuitry 14.

During the first operating mode, the first dual output RF LNA 50 presents an open circuit at the first beta output BF, the second dual output RF LNA 52 presents an open circuit at both the second alpha output AS and the second beta output BS, and the third dual output RF LNA 54 presents an open circuit at both the third alpha output AT and the third beta output BT.

During a second operating mode of the group of operating modes, the RF front-end circuitry 16 receives and processes an RF signal via the RF antenna 18 to provide the first RF receive signal RXF to the first input impedance matching circuit 20, which forwards the first RF receive signal RXF to provide the first LNA input signal LNF to the first dual output RF LNA 50, which receives and amplifies the first LNA input signal LNF to provide a second impedance matching input signal MNS to the second output impedance matching circuit 58 via the first beta output BF.

During the second operating mode, the first dual output RF LNA 50 presents an open circuit at the first alpha output AF, the second dual output RF LNA 52 presents an open circuit at both the second alpha output AS and the second beta output BS, and the third dual output RF LNA 54 presents an open circuit at both the third alpha output AT and the third beta output BT.

During a third operating mode of the group of operating modes, the RF front-end circuitry 16 receives and processes an RF signal via the RF antenna 18 to provide the first RF receive signal RXF to the first input impedance matching circuit 20, which forwards the first RF receive signal RXF to provide the first LNA input signal LNF to the first dual output RF LNA 50, which receives and amplifies the first LNA input signal LNF to provide a first impedance matching input signal MNF to the first output impedance matching circuit 56 via the first alpha output AF and further receives and amplifies the first LNA input signal LNF to provide the second impedance matching input signal MNS to the second output impedance matching circuit 58 via the first beta output BF.

During the third operating mode, the second dual output RF LNA 52 presents an open circuit at both the second alpha output AS and the second beta output BS, and the third dual output RF LNA 54 presents an open circuit at both the third alpha output AT and the third beta output BT. In one embodiment of the first dual output RF LNA 50, the first dual output RF LNA 50 provides intra-band carrier aggregation.

During a fourth operating mode of the group of operating modes, the RF front-end circuitry 16 receives and processes an RF signal via the RF antenna 18 to provide a second RF receive signal RXS to the second input impedance matching circuit 22, which forwards the second RF receive signal RXS to provide a second LNA input signal LNS to the second dual output RF LNA 52, which receives and amplifies the second LNA input signal LNS to provide the first impedance matching input signal MNF to the first output impedance matching circuit 56 via the second alpha output AS.

During the fourth operating mode, the second dual output RF LNA 52 presents an open circuit at the second beta output BS, the first dual output RF LNA 50 presents an open circuit at both the first alpha output AF and the first beta output BF, and the third dual output RF LNA 54 presents an open circuit at both the third alpha output AT and the third beta output BT.

During a fifth operating mode of the group of operating modes, the RF front-end circuitry 16 receives and processes an RF signal via the RF antenna 18 to provide the second RF receive signal RXS to the second input impedance matching circuit 22, which forwards the second RF receive signal RXS to provide the second LNA input signal LNS to the second dual output RF LNA 52, which receives and amplifies the second LNA input signal LNS to provide the second impedance matching input signal MNS to the second output impedance matching circuit 58 via the second beta output BS.

During the fifth operating mode, the first dual output RF LNA 50 presents an open circuit at both the first alpha output AF and the first beta output BF, the second dual output RF LNA 52 presents an open circuit at the second alpha output AS, and the third dual output RF LNA 54 presents an open circuit at both the third alpha output AT and the third beta output BT.

During a sixth operating mode of the group of operating modes, the RF front-end circuitry 16 receives and processes an RF signal via the RF antenna 18 to provide the second RF receive signal RXS to the second input impedance matching circuit 22, which forwards the second RF receive signal RXS to provide the second LNA input signal LNS to the second dual output RF LNA 52, which receives and amplifies the second LNA input signal LNS to provide the first impedance matching input signal MNF to the first output impedance matching circuit 56 via the second alpha output AS and further receives and amplifies the second LNA input signal LNS to provide the second impedance matching input signal MNS to the second output impedance matching circuit 58 via the second beta output BS.

During the sixth operating mode, the first dual output RF LNA 52 presents an open circuit at both the first alpha output AF and the first beta output BF, and the third dual output RF LNA 54 presents an open circuit at both the third alpha output AT and the third beta output BT.

During a seventh operating mode of the group of operating modes, the RF front-end circuitry 16 receives and processes an RF signal via the RF antenna 18 to provide a third RF receive signal RXT to the third input impedance matching circuit 24, which forwards the third RF receive signal RXT to provide a third LNA input signal LNT to the third dual output RF LNA 54, which receives and amplifies the third LNA input signal LNT to provide the first impedance matching input signal MNF to the first output impedance matching circuit 56 via the third alpha output AT.

During the seventh operating mode, the third dual output RF LNA 54 presents an open circuit at the third beta output BT, the first dual output RF LNA 50 presents an open circuit at both the first alpha output AF and the first beta output BF, and the second dual output RF LNA 52 presents an open circuit at both the second alpha output AS and the second beta output BS.

During an eighth operating mode of the group of operating modes, the RF front-end circuitry 16 receives and processes an RF signal via the RF antenna 18 to provide the third RF receive signal RXT to the third input impedance matching circuit 24, which forwards the third RF receive signal RXT to provide the third LNA input signal LNT to the third dual output RF LNA 54, which receives and amplifies the third LNA input signal LNT to provide the second impedance matching input signal MNS to the second output impedance matching circuit 58 via the third beta output BT.

During the eighth operating mode, the first dual output RF LNA 50 presents an open circuit at both the first alpha output AF and the first beta output BF, the second dual output RF LNA 52 presents an open circuit at both the second alpha output AS and the second beta output BS, and the third dual output RF LNA 54 presents an open circuit at the third alpha output AT.

During a ninth operating mode of the group of operating modes, the RF front-end circuitry 16 receives and processes an RF signal via the RF antenna 18 to provide the third RF receive signal RXT to the third input impedance matching circuit 24, which forwards the third RF receive signal RXT to provide the third LNA input signal LNT to the third dual output RF LNA 54, which receives and amplifies the third LNA input signal LNT to provide the first impedance matching input signal MNF to the first output impedance matching circuit 56 via the third alpha output AT and further receives and amplifies the third LNA input signal LNT to provide the second impedance matching input signal MNS to the second output impedance matching circuit 58 via the third beta output BT.

During the ninth operating mode, the first dual output RF LNA 50 presents an open circuit at both the first alpha output AF and the first beta output BF, and the second dual output RF LNA 52 presents an open circuit at both the second alpha output AS and the second beta output BS.

In one embodiment of the RF receive circuitry 12, the RF receive circuitry 12 includes a group of dual output RF LNAs 50, 52, 54 having a group of alpha outputs AF, AS, AT and a group of beta outputs BF, BS, BT. The group of dual output RF LNAs 50, 52, 54 includes at least the first dual output RF LNA 50. Each of the group of dual output RF LNAs 50, 52, 54 has a corresponding one of the group of alpha outputs AF, AS, AT and a corresponding one of the group of beta outputs BF, BS, BT. Each of the group of alpha outputs AF, AS, AT is coupled to the first output impedance matching circuit 56. Each of the group of beta outputs BF, BS, BT is coupled to the second output impedance matching circuit 58. In one embodiment of the RF receive circuitry 12, each of the group of alpha outputs AF, AS, AT is directly coupled to the first output impedance matching circuit 56 and each of the group of beta outputs BF, BS, BT is directly coupled to the second output impedance matching circuit 58.

In one embodiment of the RF receive circuitry 12, the RF receive circuitry 12 includes the group of dual output RF LNAs 50, 52, 54 and a group of input impedance matching circuits 20, 22, 24, such that each of the group of input impedance matching circuits 20, 22, 24 provides at least a partial impedance match to a corresponding one of the group of dual output RF LNAs 50, 52, 54. In one embodiment of the RF receive circuitry 12, the RF receive circuitry 12 includes the group of dual output RF LNAs 50, 52, 54, such that each of the group of dual output RF LNAs 50, 52, 54 receives a corresponding one of a group of LNA input signals LNF, LNS, LNT. In one embodiment of the RF receive circuitry 12, each of the group of LNA input signals LNF, LNS, LNT falls within a corresponding one of a group of RF communications bands, such that none of the group of RF communications bands overlaps another of the group of RF communications bands.

In one embodiment of the RF circuitry 10, the RF system control circuitry 14 provides a front-end control signal FEC to the RF front-end circuitry 16. The front-end control signal FEC may use the front-end control signal FEC to configure the RF front-end circuitry 16. In one embodiment of the RF circuitry 10, the RF system control circuitry 14 configures the RF front-end circuitry 16 to provide any or all of the first RF receive signal RXF, the second RF receive signal RXS, and the third RF receive signal RXT using the front-end control signal FEC.

In an alternate embodiment of the RF receive circuitry 12, any of the first input impedance matching circuit 20, the first dual output RF LNA 50, the second input impedance matching circuit 22, the second dual output RF LNA 52, the third input impedance matching circuit 24, the third dual output RF LNA 54, the first output impedance matching circuit 56, and the second output impedance matching circuit 58 are omitted.

Figure 4:
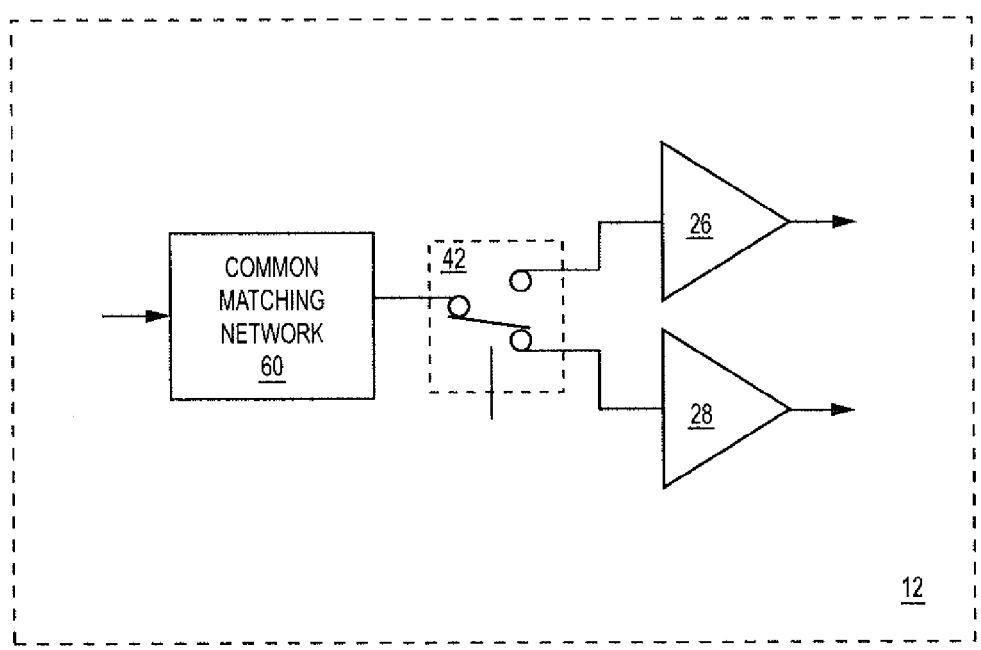
FIG. 4 shows details of RF receive circuitry according to one embodiment of the RF circuitry.

FIG. 4 shows details of RF receive circuitry 12 according to one embodiment of the RF receive circuitry 12. The RF receive circuitry 12 illustrated in FIG. 4 includes a common matching network 60, a first RF LNA 26, a second RF LNA 28, and a first RF switch 42. The first RF switch 42 is coupled between the common matching network 60 and the first RF LNA 26 and further coupled between the common matching network 60 and the second RF LNA 28. The RF receive circuitry 12 is a routing circuit for routing an RF signal through the common matching network 60 to either the first RF LNA 26 or the second RF LNA 28 using the first RF switch 42. In this regard, the first RF switch 42 is a single-pole double-throw (SPDT) switch. Therefore, the first RF switch 42 may selectively couple the common matching network 60 to either the first RF LNA 26 or the second RF LNA 28. As such, RF switching is done upstream of the first RF LNA 26 and the second RF LNA 28.

By switching upstream of the first RF LNA 26 and the second RF LNA 28, the RF receive circuitry 12 may have certain design shortcomings, such as increased insertion loss (IL), an increased noise figure (NF), reduced isolation, or any combination thereof. As such, there is a need to mitigate design shortcomings associated with switching RF signals upstream of RF low noise amplification.

Figure 5:
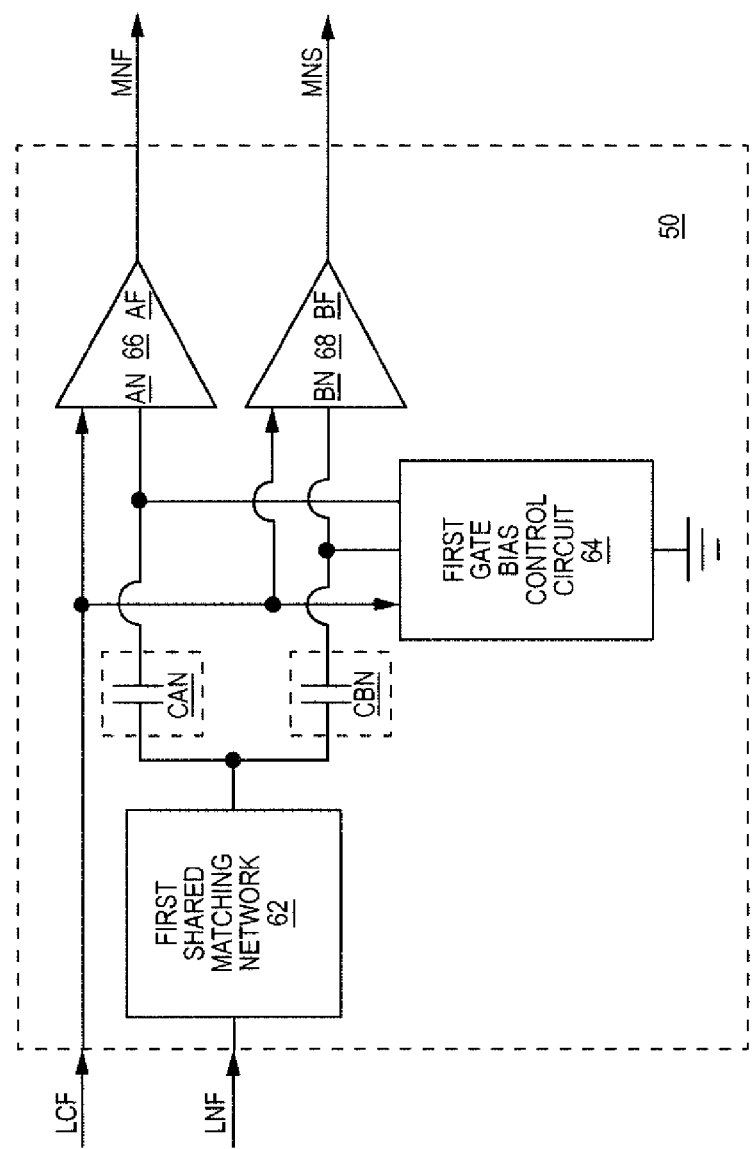
FIG. 5 shows details of a first dual output RF LNA illustrated in FIG. 3 according to one embodiment of the first dual output RF LNA.

FIG. 5 shows details of the first dual output RF LNA 50 illustrated in FIG. 3 according to one embodiment of the first dual output RF LNA 50. The first dual output RF LNA 50 includes a first shared matching network 62, a first gate bias control circuit 64, a first alpha LNA 66, a first beta LNA 68, a first alpha input capacitive element CAN, and a first beta input capacitive element CBN. The first alpha LNA 66 has a first alpha input AN and a first alpha output AF. The first beta LNA 68 has a first beta input BN and a first beta output BF. In general, the first dual output RF LNA 50 has the first alpha output AF and the first beta output BF.

The first alpha input capacitive element CAN is coupled between the first shared matching network 62 and the first alpha input AN. The first beta input capacitive element CBN is coupled between the first shared matching network 62 and the first beta input BN. The first gate bias control circuit 64 is coupled between the first alpha input AN and a ground. The first gate bias control circuit 64 is further coupled between the first beta input BN and the ground. Each of the first alpha input capacitive element CAN and the first beta input capacitive element CBN may function as a DC block to provide DC isolation of each of the first alpha LNA 66 and the first beta LNA 68, respectively, from the first shared matching network 62, such that the first gate bias control circuit 64 can control bias to the first alpha LNA 66 via the first alpha input AN, can control bias to the first beta LNA 68 via the first beta input BN, or both. In this regard, the first gate bias control circuit 64 may enable or disable each of the first alpha LNA 66 and the first beta LNA 68.

The first output impedance matching circuit 56 (FIG. 3) is coupled to the first alpha output AF. The second output impedance matching circuit 58 (FIG. 3) is coupled to the first beta output BF. The first gate bias control circuit 64 selects one of enabled and disabled of the first alpha LNA 66 using an alpha bias signal via the first alpha input AN. The first gate bias control circuit 64 selects one of enabled and disabled of the first beta LNA 68 using a beta bias signal via the first beta input BN.

The RF system control circuitry 14 (FIG. 3) provides the first LNA configuration signal LCF to first gate bias control circuit 64, the first alpha LNA 66, and the first beta LNA 68. The first alpha LNA 66 is one of enabled and disabled based on the first gate bias control circuit 64. The RF system control circuitry 14 (FIG. 3) selects the one of enabled and disabled of the first alpha LNA 66 using the first LNA configuration signal LCF via the first gate bias control circuit 64. The first beta LNA 68 is one of enabled and disabled based on the first gate bias control circuit 64. The RF system control circuitry 14 (FIG. 3) selects the one of enabled and disabled of the first beta LNA 68 using the first LNA configuration signal LCF via the first gate bias control circuit 64. Since the first gate bias control circuit 64 is coupled to the first alpha LNA 66 and the first beta LNA 68 in a shunt configuration, the first gate bias control circuit 64 may enable and disable each of the first alpha LNA 66 and the first beta LNA 68 while avoiding drawbacks of the series configuration illustrated in FIG. 4.

In one embodiment of the first dual output RF LNA 50, during the first operating mode, the first alpha LNA 66 is enabled and the first beta LNA 68 is disabled; during the second operating mode, the first alpha LNA 66 is disabled and the first beta LNA 68 is enabled; and during the third operating mode, both the first alpha LNA 66 and the first beta LNA 68 are enabled. In one embodiment of the first dual output RF LNA 50, during the first operating mode, the first alpha LNA 66 has a first gain and the first beta LNA 68 is disabled. In one embodiment of the first dual output RF LNA 50, during the second operating mode, the first alpha LNA 66 is disabled and the first beta LNA 68 has a second gain. In one embodiment of the first dual output RF LNA 50, during the third operating mode, the first alpha LNA 66 has the first gain and the first beta LNA 68 has the second gain.

In one embodiment of the first dual output RF LNA 50, the first gain, the second gain, or both are programmable. In one embodiment of the first dual output RF LNA 50, RF system control circuitry 14 (FIG. 3) selects the first gain, the second gain, or both using the first LNA configuration signal LCF. In one embodiment of the first dual output RF LNA 50, the first gate bias control circuit 64 adjusts the alpha bias signal via the first alpha input AN, the beta bias signal via the first beta input BN, or both to provide the first gain, the second gain, or both, respectively.

In an alternate embodiment of the first dual output RF LNA 50, the first alpha input capacitive element CAN, the first beta input capacitive element CBN, or both are omitted, such that the first shared matching network 62 is directly coupled to the input to the first alpha LNA 66, the input to the first beta LNA 68, or both.

Figure 6B:
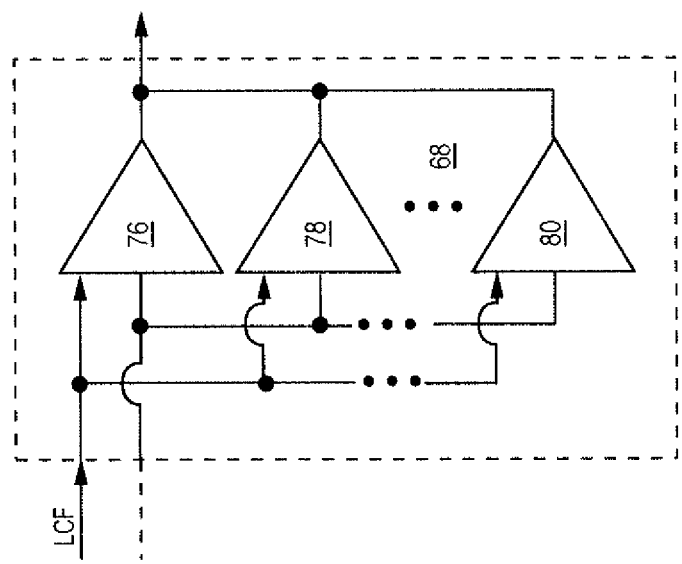
FIGS. 6A and 6B show details of a first alpha LNA and a first beta LNA illustrated in FIG. 5 according to one embodiment of the first alpha LNA and the first beta LNA.
Figure 6A:
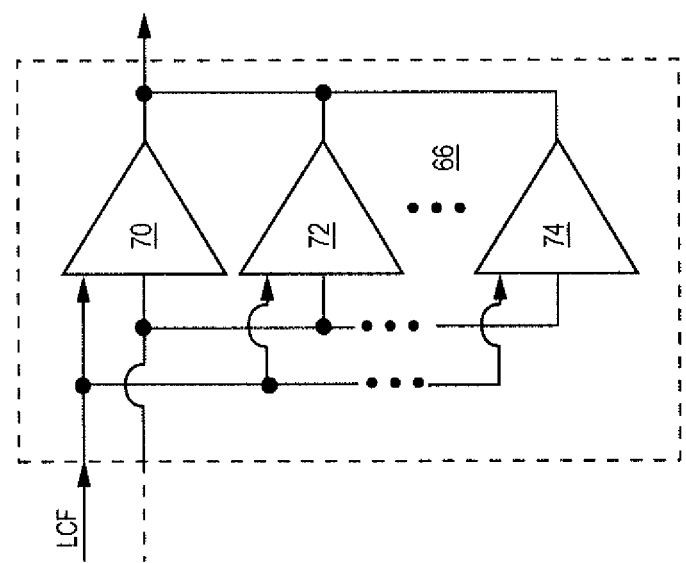

FIGS. 6A and 6B show details of the first alpha LNA 66 and the first beta LNA 68, respectively, illustrated in FIG. 5 according to one embodiment of the first alpha LNA 66 and the first beta LNA 68. The first alpha LNA 66 is a digital-to-analog converter (DAC) LNA that includes a first alpha sub-LNA 70, a second alpha sub-LNA 72, and up to and including an $N^{TH}$ alpha sub-LNA 74. In general, the first alpha LNA 66 includes a group of alpha sub-LNAs 70, 72, 74 coupled in parallel with one another. The first beta LNA 68 is a DAC LNA that includes a first beta sub-LNA 76, a second beta sub-LNA 78, and up to and including an $M^{TH}$ beta sub-LNA 80. In general, the first beta LNA 68 includes a group of beta sub-LNAs 76, 78, 80 coupled in parallel with one another.

The RF system control circuitry 14 (FIG. 3) enables a portion of the group of alpha sub-LNAs 70, 72, 74 using the first LNA configuration signal LCF, such that the first gain of the first alpha LNA 66 is based on the enabled portion of the group of alpha sub-LNAs 70, 72, 74. Similarly, the RF system control circuitry 14 (FIG. 3) enables a portion of the group of beta sub-LNAs 76, 78, 80 using the first LNA configuration signal LCF, such that the second gain of the first beta LNA 68 is based on the enabled portion of the group of beta sub-LNAs 76, 78, 80.

Figure 7:
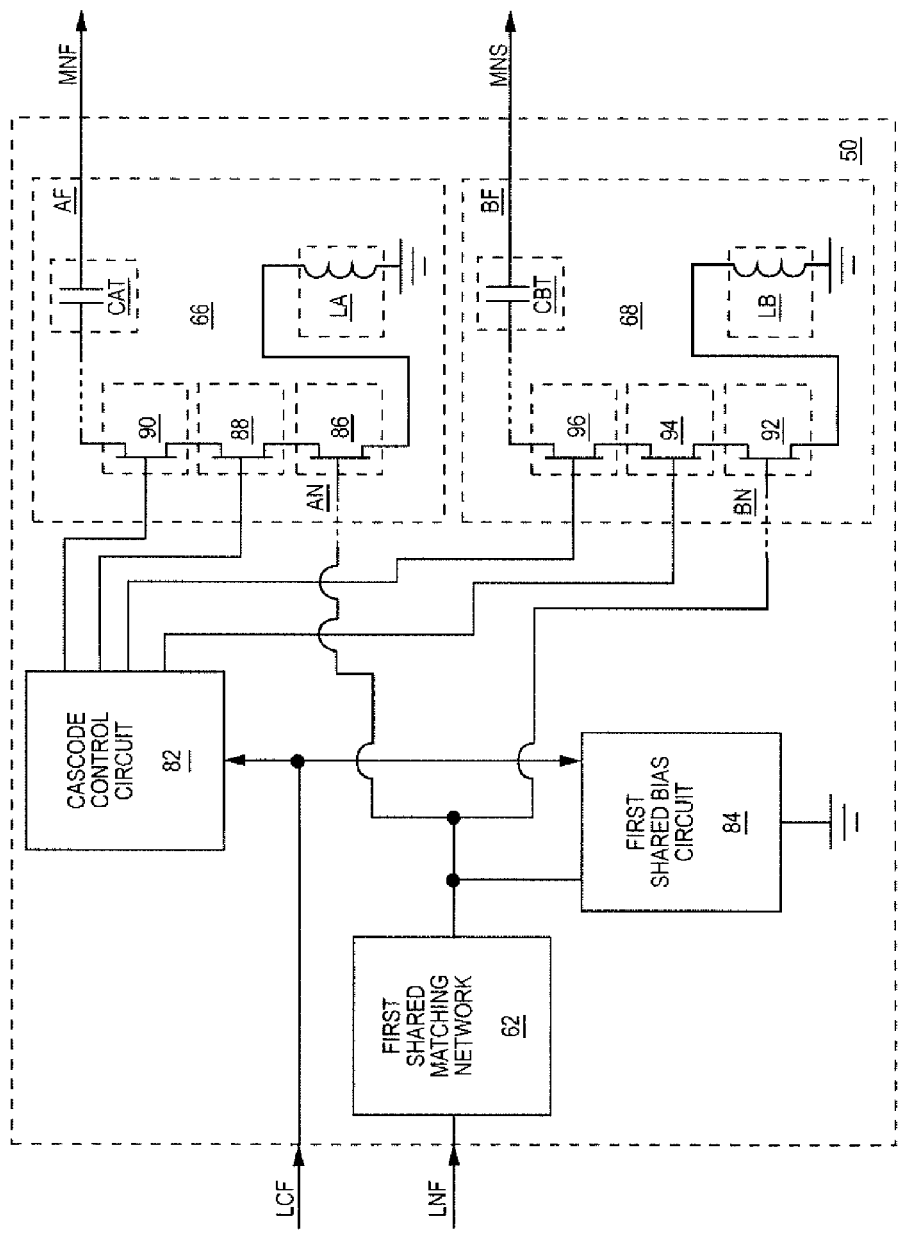
FIG. 7 shows details of the first dual output RF LNA illustrated in FIG. 3 according to an alternate embodiment of the first dual output RF LNA.

FIG. 7 shows details of the first dual output RF LNA 50 illustrated in FIG. 3 according to an alternate embodiment of the first dual output RF LNA 50. The first dual output RF LNA 50 has the first alpha output AF and the first beta output BF. In addition, the first dual output RF LNA 50 includes the first shared matching network 62, a cascode control circuit 82, a first shared bias circuit 84, the first alpha LNA 66, and the first beta LNA 68.

The first shared bias circuit 84 is coupled between the input to the first alpha LNA 66 and ground. The first shared bias circuit 84 is further coupled between the input to the first beta LNA 68 and ground. In this regard, the first shared bias circuit 84 provides a shared bias to the first alpha LNA 66 and the first beta LNA 68.

An output from the first alpha LNA 66 is coupled to the first alpha output AF. An output from the first beta LNA 68 is coupled to the first beta output BF. The first alpha LNA 66 is coupled to the first output impedance matching circuit 56 (FIG. 3) via the first alpha output AF. The first beta LNA 68 is coupled to the second output impedance matching circuit 58 (FIG. 3) via the first beta output BF.

The RF system control circuitry 14 (FIG. 3) provides the first LNA configuration signal LCF to first shared bias circuit 84 and the cascode control circuit 82. The first alpha LNA 66 is one of enabled and disabled based on the cascode control circuit 82. The RF system control circuitry 14 (FIG. 3) selects the one of enabled and disabled of the first alpha LNA 66 using the first LNA configuration signal LCF via the cascode control circuit 82. The first beta LNA 68 is one of enabled and disabled based on the cascode control circuit 82. The RF system control circuitry 14 (FIG. 3) selects the one of enabled and disabled of the first beta LNA 68 using the first LNA configuration signal LCF via the cascode control circuit 82. Since the cascode control circuit 82 is coupled to the first alpha LNA 66 and the first beta LNA 68 in a shunt configuration, the cascode control circuit 82 may enable and disable each of the first alpha LNA 66 and the first beta LNA 68 while avoiding drawbacks of the series configuration illustrated in FIG. 4.

The first alpha LNA 66 includes a first alpha amplifier transistor element 86, a first alpha cascode transistor element 88, and a second alpha cascode transistor element 90 coupled in series between the first alpha output AF and ground. The first shared bias circuit 84 is coupled to a gate of the first alpha amplifier transistor element 86. The cascode control circuit 82 is coupled to a gate of the first alpha cascode transistor element 88 and further coupled to a gate of the second alpha cascode transistor element 90. In one embodiment of the first alpha LNA 66, the first alpha cascode transistor element 88 and the second alpha cascode transistor element 90 provide a double cascode configuration.

In an alternate embodiment of the first alpha LNA 66, the second alpha cascode transistor element 90 is omitted. However, without the second alpha cascode transistor element 90, isolation of the first alpha LNA 66 when the first alpha LNA 66 is disabled may be reduced. In one embodiment of the first alpha LNA 66, the first alpha LNA 66 further includes an alpha inductive element LA coupled between the first alpha amplifier transistor element 86 and ground. In one embodiment of the first alpha LNA 66, the first alpha LNA 66 further includes a first alpha output capacitive element CAT coupled between the first alpha output AF and the alpha transistor elements 86, 88, 90.

In one embodiment of the first alpha LNA 66, the cascode control circuit 82 uses the first alpha cascode transistor element 88 to select the one of enabled and disabled of the first alpha LNA 66. In one embodiment of the first alpha LNA 66, the cascode control circuit 82 uses the second alpha cascode transistor element 90 to select the one of enabled and disabled of the first alpha LNA 66. In one embodiment of the first alpha LNA 66, the cascode control circuit 82 uses the first alpha cascode transistor element 88 and the second alpha cascode transistor element 90 to select the one of enabled and disabled of the first alpha LNA 66.

The first beta LNA 68 includes a first beta amplifier transistor element 92, a first beta cascode transistor element 94, and a second beta cascode transistor element 96 coupled in series between the first beta output BF and ground. The first shared bias circuit 84 is coupled to a gate of the first beta amplifier transistor element 92. The cascode control circuit 82 is coupled to a gate of the first beta cascode transistor element 94 and further coupled to a gate of the second beta cascode transistor element 96. In one embodiment of the first beta LNA 68, the first beta cascode transistor element 94 and the second beta cascode transistor element 96 provide a double cascode configuration.

In an alternate embodiment of the first beta LNA 68, the second beta cascode transistor element 96 is omitted. However, without the second beta cascode transistor element 96, isolation of the first beta LNA 68 when the first beta LNA 68 is disabled may be reduced. In one embodiment of the first beta LNA 68, the first beta LNA 68 further includes a beta inductive element LB coupled between the first beta amplifier transistor element 92 and ground. In one embodiment of the first beta LNA 68, the first beta LNA 68 further includes a first beta output capacitive element CBT coupled between the first beta output BF and the beta transistor elements 92, 94, 96.

In one embodiment of the first beta LNA 68, the cascode control circuit 82 uses the first beta cascode transistor element 94 to select the one of enabled and disabled of the first beta LNA 68. In one embodiment of the first beta LNA 68, the cascode control circuit 82 uses the second beta cascode transistor element 96 to select the one of enabled and disabled of the first beta LNA 68. In one embodiment of the first beta LNA 68, the cascode control circuit 82 uses the first beta cascode transistor element 94 and the second beta cascode transistor element 96 to select the one of enabled and disabled of the first beta LNA 68.

In one embodiment of the first dual output RF LNA 50, during the first operating mode, the first alpha LNA 66 is enabled and the first beta LNA 68 is disabled; during the second operating mode, the first alpha LNA 66 is disabled and the first beta LNA 68 is enabled; and during the third operating mode, both the first alpha LNA 66 and the first beta LNA 68 are enabled. In one embodiment of the first dual output RF LNA 50, during the first operating mode, the first alpha LNA 66 has a first gain and the first beta LNA 68 is disabled. In one embodiment of the first dual output RF LNA 50, during the second operating mode, the first alpha LNA 66 is disabled and the first beta LNA 68 has a second gain. In one embodiment of the first dual output RF LNA 50, during the third operating mode, the first alpha LNA 66 has the first gain and the first beta LNA 68 has the second gain.

In one embodiment of the first dual output RF LNA 50, the first gain, the second gain, or both are programmable. In one embodiment of the first dual output RF LNA 50, RF system control circuitry 14 (FIG. 3) selects the first gain, the second gain, or both using the first LNA configuration signal LCF.

In an alternate embodiment of the first dual output RF LNA 50, the first alpha input capacitive element CAN, the first beta input capacitive element CBN, or both are omitted, such that the first shared matching network 62 is directly coupled to the input to the first alpha input AN, the first beta input BN, or both.

Figure 8:
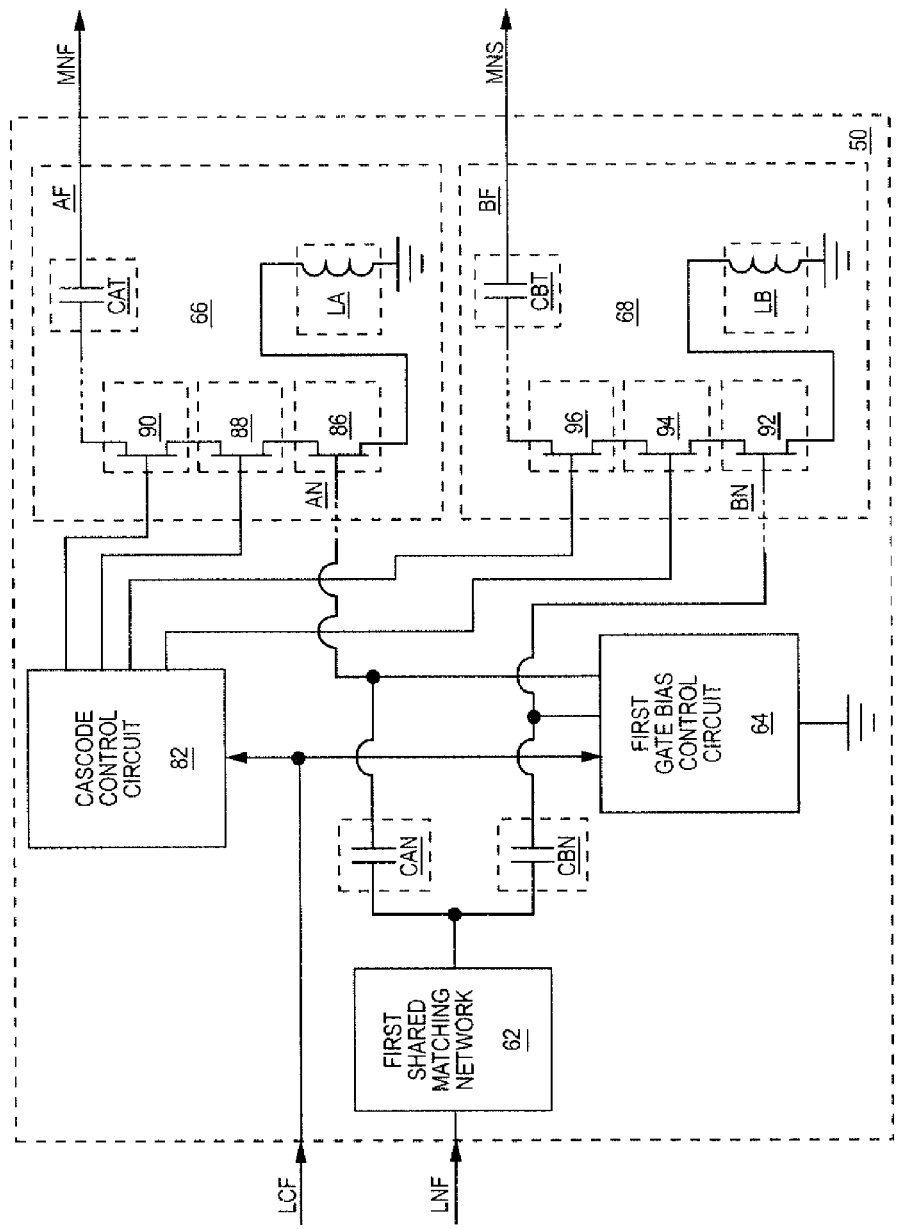
FIG. 8 shows details of the first dual output RF LNA illustrated in FIG. 3 according to an additional embodiment of the first dual output RF LNA.

FIG. 8 shows details of the first dual output RF LNA 50 illustrated in FIG. 3 according to an additional embodiment of the first dual output RF LNA 50. The first dual output RF LNA 50 illustrated in FIG. 8 is similar to the first dual output RF LNA 50 illustrated in FIG. 7, except the first dual output RF LNA 50 illustrated in FIG. 8 further includes the first alpha input capacitive element CAN and the first beta input capacitive element CBN. The first alpha input capacitive element CAN is coupled between the first shared matching network 62 and the gate of the first alpha amplifier transistor element 86. The first beta input capacitive element CBN is coupled between the first shared matching network 62 and the gate of the first beta amplifier transistor element 92. Further, the first shared bias circuit 84 is replaced with the first gate bias control circuit 64.

In one embodiment of the first dual output RF LNA 50, when the first alpha LNA 66 is enabled by the first gate bias control circuit 64 using the bias signal via the first alpha input AN, the first alpha cascode transistor element 88 is enabled by the cascode control circuit 82. When the first beta LNA 68 is enabled by the first gate bias control circuit 64 using the bias signal via the first beta input BN, the first beta cascode transistor element 94 is enabled by the cascode control circuit 82.

In one embodiment of the first dual output RF LNA 50, when the first alpha LNA 66 is disabled by the first gate bias control circuit 64 using the bias signal via the first alpha input AN, the first alpha cascode transistor element 88 is disabled by the cascode control circuit 82. By disabling the first alpha LNA 66 using both the bias signal and the first alpha cascode transistor element 88, isolation of the first alpha LNA 66 may be increased. When the first beta LNA 68 is disabled by the first gate bias control circuit 64 using the bias signal via the first beta input BN, the first beta cascode transistor element 94 is disabled by the cascode control circuit 82. By disabling the first beta LNA 68 using both the bias signal and the first beta cascode transistor element 94, isolation of the first beta LNA 68 may be increased.

Figure 9:
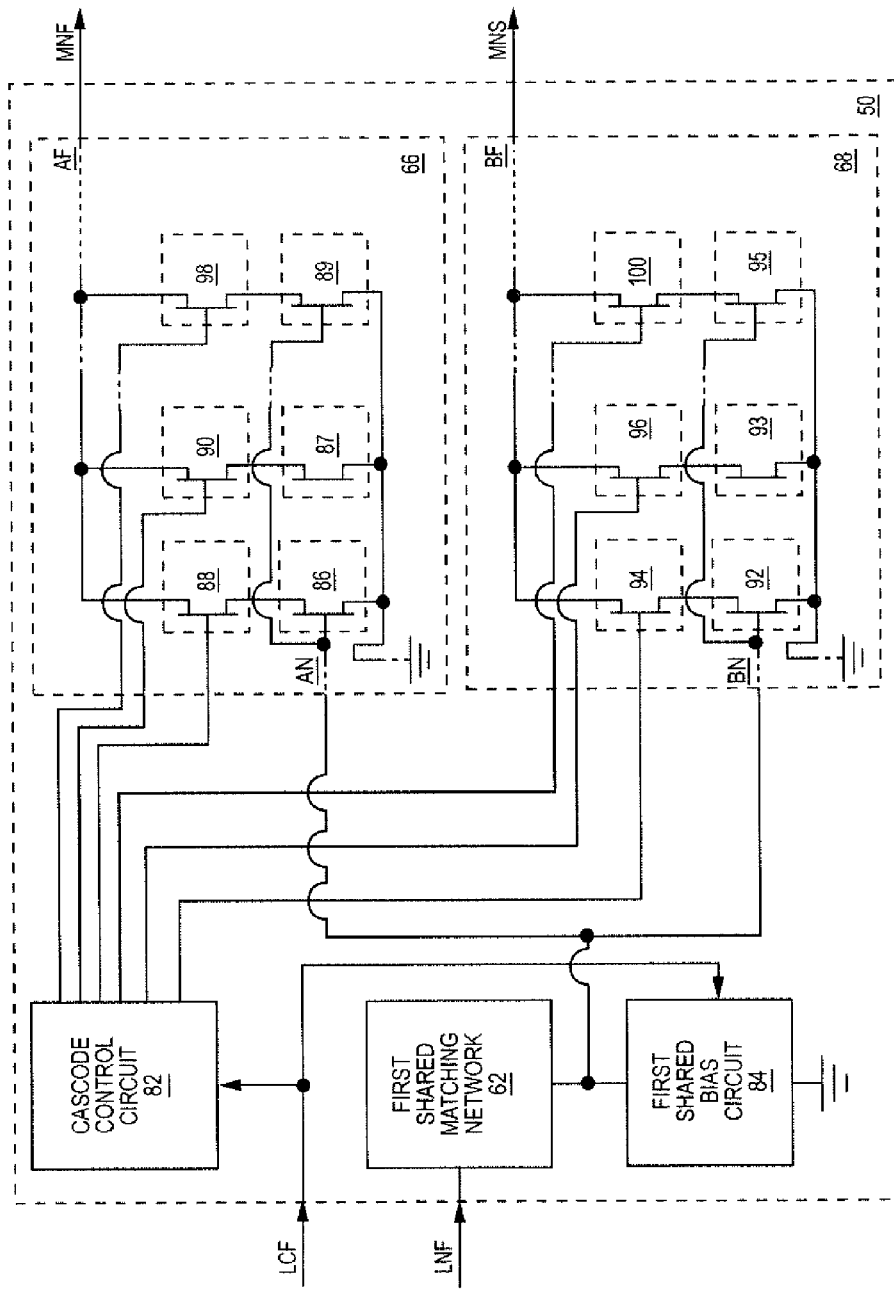
FIG. 9 shows details of the first dual output RF LNA illustrated in FIG. 3 according to another embodiment of the first dual output RF LNA.

FIG. 9 shows details of the first dual output RF LNA 50 illustrated in FIG. 3 according to another embodiment of the first dual output RF LNA 50. The first dual output RF LNA 50 illustrated in FIG. 9 is similar to the first dual output RF LNA 50 illustrated in FIG. 7, except in the first dual output RF LNA 50 illustrated in FIG. 9, the first alpha output capacitive element CAT, the first beta output capacitive element CBT, the alpha inductive element LA, and the beta inductive element LB are not shown. In addition, the configuration of the first alpha LNA 66 and the first beta LNA 68 shown in FIG. 9 is different from the configuration of the first alpha LNA 66 and the first beta LNA 68 illustrated in FIG. 7. In one embodiment of the first alpha LNA 66, the first alpha LNA 66 is a DAC LNA. In one embodiment of the first beta LNA 68, the first beta LNA 68 is a DAC LNA.

The first alpha LNA 66 illustrated in FIG. 9 includes the first alpha amplifier transistor element 86, a second alpha amplifier transistor element 87, the first alpha cascode transistor element 88, up to and including a $P^{TH}$ alpha amplifier transistor element 89, the second alpha cascode transistor element 90, and up to and including a $P^{TH}$ alpha cascode transistor element 98. The first alpha amplifier transistor element 86 and the first alpha cascode transistor element 88 are coupled in series to form a first alpha sub-LNA between the first alpha output AF and ground. The second alpha amplifier transistor element 87 and the second alpha cascode transistor element 90 are coupled in series to form a second alpha sub-LNA between the first alpha output AF and ground. The $P^{TH}$ alpha amplifier transistor element 89 and the $P^{TH}$ alpha cascode transistor element 98 are coupled in series to form a $P^{TH}$ alpha sub-LNA between the first alpha output AF and ground.

As such, the first alpha LNA 66 includes a group of alpha cascode transistor elements 88, 90, 98 and a group of alpha amplifier transistor elements 86, 87, 89, such that each of the group of alpha cascode transistor elements 88, 90, 98 is coupled in series with a corresponding one of the group of alpha amplifier transistor elements 86, 87, 89 between the first alpha output AF and ground to form a group of alpha sub-LNAs coupled in parallel with one another. A gate of each of the group of alpha amplifier transistor elements 86, 87, 89 is coupled to the first alpha input AN. The cascode control circuit 82 is coupled to corresponding gates of each of the group of alpha cascode transistor elements 88, 90, 98. The cascode control circuit 82 enables or disables each of the group of alpha cascode transistor elements 88, 90, 98 based on the first LNA configuration signal LCF. A gain of the first alpha LNA 66 is based on a number of the group of alpha cascode transistor elements 88, 90, 98 that are enabled. Therefore, the gain of the first alpha LNA 66 is based on a number of the group of alpha sub-LNAs that are enabled. As such, the RF system control circuitry 14 (FIG. 3) selects the gain of the first alpha LNA 66 using the first LNA configuration signal LCF.

The first beta LNA 68 illustrated in FIG. 9 includes the first beta amplifier transistor element 92, a second beta amplifier transistor element 93, and up to and including a $Q^{TH}$ beta amplifier transistor element 95. The first beta LNA 68 further includes the first beta cascode transistor element 94, the second beta cascode transistor element 96, and up to and including a $Q^{TH}$ beta cascode transistor element 100. The first beta amplifier transistor element 92 and the first beta cascode transistor element 94 are coupled in series to form a first beta sub-LNA between the first beta output BF and ground. The second beta amplifier transistor element 93 and the second beta cascode transistor element 96 are coupled in series to form a second beta sub-LNA between the first beta output BF and ground. The $Q^{TH}$ beta amplifier transistor element 95 and the $Q^{TH}$ beta cascode transistor element 100 are coupled in series to form a $Q^{TH}$ beta sub-LNA between the first beta output BF and ground.

As such, the first beta LNA 68 includes a group of beta cascode transistor elements 94, 96, 100 and a group of beta amplifier transistor elements 92, 93, 95, such that each of the group of beta cascode transistor elements 94, 96, 100 is coupled in series with a corresponding one of the group of beta amplifier transistor elements 92, 93, 95 between the first beta output BF and ground to form a group of beta sub-LNAs coupled in parallel with one another. A gate of each of the group of beta amplifier transistor elements 92, 93, 95 is coupled to the first beta input BN. The first shared bias circuit 84 is coupled to a gate of each of the group of alpha amplifier transistor elements 86, 87, 89 via the first alpha input AN and further coupled to a gate of each of the group of beta amplifier transistor elements 92, 93, 95 via the first beta input BN.

The cascode control circuit 82 is coupled to corresponding gates of each of the group of beta cascode transistor elements 94, 96, 100. The cascode control circuit 82 enables or disables each of the group of beta cascode transistor elements 94, 96, 100 based on the first LNA configuration signal LCF. A gain of the first beta LNA 68 is based on a number of the group of beta cascode transistor elements 94, 96, 100 that are enabled. As such, the RF system control circuitry 14 (FIG. 3) selects the gain of the first beta LNA 68 using the first LNA configuration signal LCF. Therefore, the gain of the first beta LNA 68 is based on a number of the group of beta sub-LNAs that are enabled.

Figure 10:
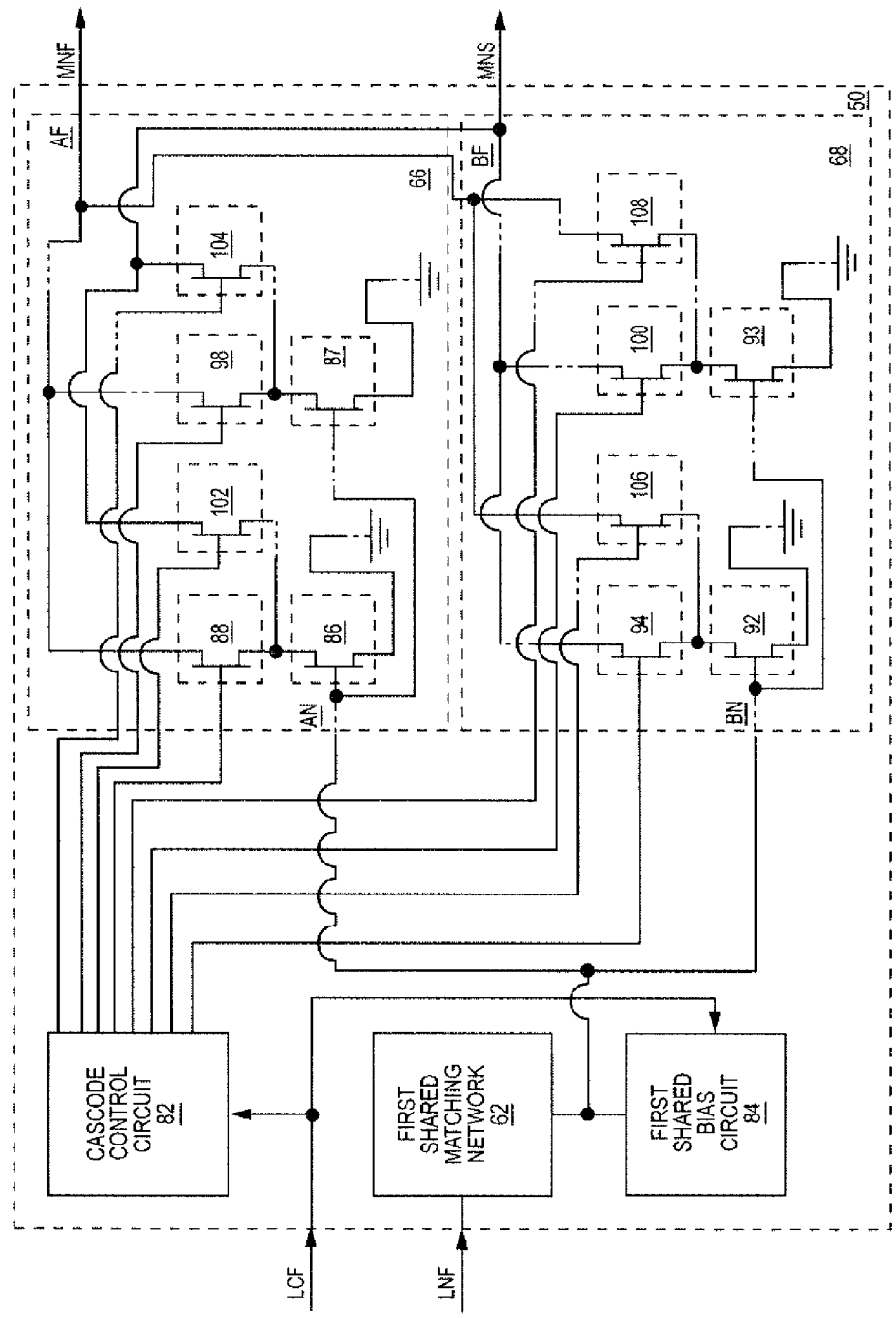
FIG. 10 shows details of the first dual output RF LNA illustrated in FIG. 3 according to a further embodiment of the first dual output RF LNA.

FIG. 10 shows details of the first dual output RF LNA 50 illustrated in FIG. 3 according to a further embodiment of the first dual output RF LNA 50. The first dual output RF LNA 50 illustrated in FIG. 10 is similar to the first dual output RF LNA 50 illustrated in FIG. 9, except that in the first dual output RF LNA 50 illustrated in FIG. 10, the first alpha LNA 66 and the first beta LNA 68 have different configurations. The first dual output RF LNA 50 illustrated in FIG. 10 has a crossover architecture. As such, the first alpha LNA 66 further includes a first alpha crossover cascode transistor element 102 and up to and including an $R^{TH}$ alpha crossover cascode transistor element 104, and the first beta LNA 68 further includes a first beta crossover cascode transistor element 106 and up to and including an $S^{TH}$ beta crossover cascode transistor element 108.

In general, the first alpha LNA 66 includes the first alpha amplifier transistor element 86, the second alpha amplifier transistor element 87, the group of alpha cascode transistor elements 88, 90 (not shown), 98, and a group of alpha crossover cascode transistor elements 102, 104. The first beta LNA 68 includes the first beta amplifier transistor element 92, the second beta amplifier transistor element 93, the group of beta cascode transistor elements 94, 96 (not shown), 100, and a group of beta crossover cascode transistor elements 106, 108.

The first alpha amplifier transistor element 86 and the first alpha cascode transistor element 88 are coupled in series between the first alpha output AF and ground. The first alpha amplifier transistor element 86 and the first alpha crossover cascode transistor element 102 are coupled in series between the first beta output BF and ground. The second alpha amplifier transistor element 87 and the $P^{TH}$ alpha cascode transistor element 98 are coupled in series between the first alpha output AF and ground. The second alpha amplifier transistor element 87 and the $R^{TH}$ alpha crossover cascode transistor element 104 are coupled in series between the first beta output BF and ground.

The first beta amplifier transistor element 92 and the first beta cascode transistor element 94 are coupled in series between the first beta output BF and ground. The first beta amplifier transistor element 92 and the first beta crossover cascode transistor element 106 are coupled in series between the first alpha output AF and ground. The second beta amplifier transistor element 93 and the $Q^{TH}$ beta cascode transistor element 100 are coupled in series between the first beta output BF and ground. The second beta amplifier transistor element 93 and the $S^{TH}$ beta crossover cascode transistor element 108 are coupled in series between the first alpha output AF and ground.

The addition of the crossover cascode transistor elements 102, 104, 106, 108 provides cross coupling to increase flexibility of the first dual output RF LNA 50. A magnitude of cross coupling is based on a number of the crossover cascode transistor elements 102, 104, 106, 108 that are enabled. As such, the RF system control circuitry 14 (FIG. 3) selects the magnitude of cross coupling using the first LNA configuration signal LCF.

Figure 11:
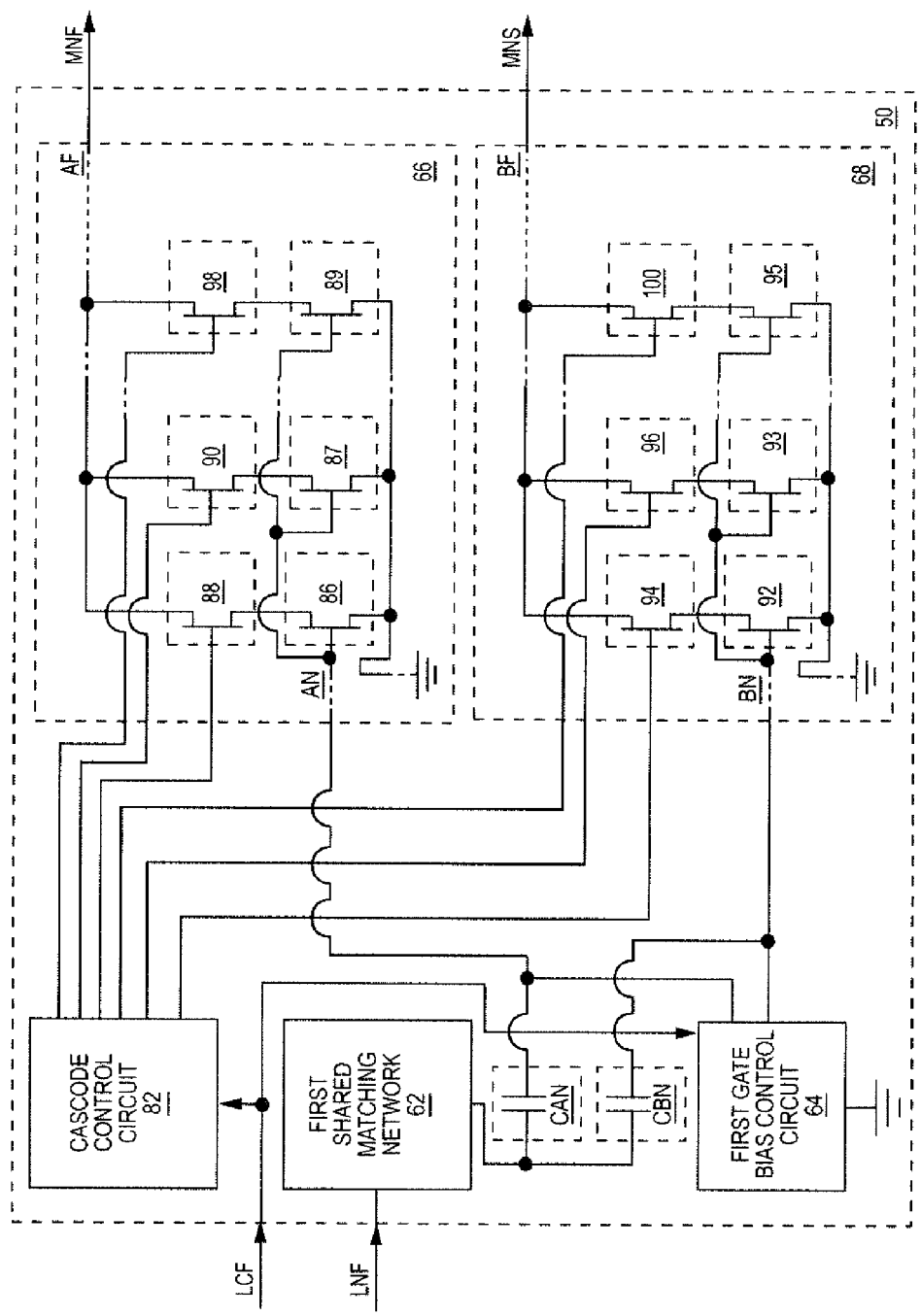
FIG. 11 shows details of the first dual output RF LNA illustrated in FIG. 3 according to another embodiment of the first dual output RF LNA.

FIG. 11 shows details of the first dual output RF LNA 50 illustrated in FIG. 3 according to another embodiment of the first dual output RF LNA 50. The first dual output RF LNA 50 illustrated in FIG. 11 is similar to the first dual output RF LNA 50 illustrated in FIG. 9, except in the first dual output RF LNA 50 illustrated in FIG. 11, the first shared bias circuit 84 is replaced with the first gate bias control circuit 64 and the first dual output RF LNA 50 further includes the first alpha input capacitive element CAN and the first beta input capacitive element CBN.

The first alpha input capacitive element CAN is coupled between the first shared matching network 62 and the first alpha input AN. The first beta input capacitive element CBN is coupled between the first shared matching network 62 and the first beta input BN. In one embodiment of the first dual output RF LNA 50, the gain of the first alpha LNA 66 is based on the alpha bias signal via the first alpha input AN and a number of the group of alpha sub-LNAs that are enabled. In one embodiment of the first dual output RF LNA 50, the gain of the first beta LNA 68 is based on the beta bias signal via the first beta input BN and a number of the group of beta sub-LNAs that are enabled.

Those skilled in the art will recognize improvements and modifications to the preferred embodiments of the present disclosure. All such improvements and modifications are considered within the scope of the concepts disclosed herein and the claims that follow.

What is claimed is:

1. Radio Frequency (RF) receive circuitry comprising:
   a first output impedance matching circuit coupled to a first alpha output of a first alpha Low Noise Amplifier (LNA);
   a second output impedance matching circuit coupled to a first beta output of a first beta LNA; and
   a first dual output RF LNA comprising the first alpha LNA, the first beta LNA, and a first gate bias control circuit, which is:
      coupled between a first alpha input of the first alpha LNA and ground;
      further coupled between a first beta input of the first beta LNA and the ground;
      configured to select one of enabled and disabled of the first alpha LNA using an alpha bias signal via the first alpha input; and
      further configured to select one of enabled and disabled of the first beta LNA using a beta bias signal via the first beta input.

2. The RF receive circuitry of claim 1 wherein the first dual output RF LNA further comprises:
   a first shared matching network;
   a first alpha input capacitive element coupled between the first shared matching network and the first alpha input; and
   a first beta input capacitive element coupled between the first shared matching network and the first beta input.

3. The RF receive circuitry of claim 1 configured to operate in a plurality of operating modes comprising a first operating mode, a second operating mode, and a third operating mode, wherein:
   during the first operating mode, the first alpha LNA is configured to be enabled and the first beta LNA is configured to be disabled;
   during the second operating mode, the first alpha LNA is configured to be disabled and the first beta LNA is configured to be enabled; and
   during the third operating mode, the first alpha LNA is configured to be enabled and the first beta LNA is configured to be enabled.

4. The RF receive circuitry of claim 3 wherein during the third operating mode, the first dual output RF LNA is configured to provide intra-band carrier aggregation.

5. The RF receive circuitry of claim 3 wherein RF system control circuitry is configured to select one of the plurality of operating modes.

6. The RF receive circuitry of claim 3 wherein during the first operating mode, the first alpha LNA has a first gain; during the second operating mode, the first beta LNA has a second gain; and during the third operating mode, the first alpha LNA has the first gain and the first beta LNA has the second gain.

7. The RF receive circuitry of claim 6 wherein the first alpha LNA comprises a plurality of alpha sub-LNAs, such that the first gain is based on the alpha bias signal and a portion of the plurality of alpha sub-LNAs that are enabled; and the first beta LNA comprises a plurality of beta sub-LNAs, such that the second gain is based on the beta bias signal and a portion of the beta sub-LNAs that are enabled.

8. The RF receive circuitry of claim 3 wherein during the first operating mode, the first alpha LNA has a first gain, which is programmable; during the second operating mode, the first beta LNA has a second gain, which is programmable; during the third operating mode, the first alpha LNA has the first gain and the first beta LNA has the second gain; and RF system control circuitry is configured to select each of the first gain and the second gain.

9. The RF receive circuitry of claim 1 wherein the first alpha LNA is a digital-to-analog converter (DAC) LNA comprising a plurality of alpha sub-LNAs coupled in parallel with one another, and the first beta LNA is a DAC LNA comprising a plurality of beta sub-LNAs coupled in parallel with one another.

10. The RF receive circuitry of claim 9 wherein the first alpha LNA has a first gain based on an enabled portion of the plurality of alpha sub-LNAs, and the first beta LNA has a second gain based on an enabled portion of the plurality of beta sub-LNAs.

11. The RF receive circuitry of claim 1 wherein an impedance of the first output impedance matching circuit is tunable, an impedance of the second output impedance matching circuit is tunable, and RF system control circuitry is configured to tune the impedance of the first output impedance matching circuit and further configured to tune the impedance of the second output impedance matching circuit.

12. The RF receive circuitry of claim 1 further comprising a plurality of dual output RF LNAs having a plurality of alpha outputs and a plurality of beta outputs, wherein:
   the plurality of dual output RF LNAs comprises the first dual output RF LNA;

each of the plurality of dual output RF LNAs has a corresponding one of the plurality of alpha outputs and a corresponding one of the plurality of beta outputs;
each of the plurality of alpha outputs is coupled to the first output impedance matching circuit; and
each of the plurality of beta outputs is coupled to the second output impedance matching circuit.

13. The RF receive circuitry of claim 12 further comprising a plurality of input impedance matching circuits wherein each of the plurality of input impedance matching circuits is configured to provide at least a partial impedance match to a corresponding one of the plurality of dual output RF LNAs.

14. The RF receive circuitry of claim 12 wherein each of the plurality of dual output RF LNAs is configured to receive a corresponding one of a plurality of LNA input signals.

15. The RF receive circuitry of claim 14 wherein each of the plurality of LNA input signals falls within a corresponding one of a plurality of RF communications bands, such that none of the plurality of RF communications bands overlaps another of the plurality of RF communications bands.

16. The RF receive circuitry of claim 12 wherein:
each of the plurality of alpha outputs is directly coupled to the first output impedance matching circuit; and
each of the plurality of beta outputs is directly coupled to the second output impedance matching circuit.

17. The RF receive circuitry of claim 1 wherein the first dual output RF LNA further comprises a first cascode control circuit, such that:
the first alpha LNA comprises a first alpha cascode transistor element coupled between the first alpha output and the ground, wherein the first cascode control circuit is configured to select one of enabled and disabled of the first alpha cascode transistor element based on the one of enabled and disabled of the first alpha LNA; and
the first beta LNA comprises a first beta cascode transistor element coupled between the first beta output and the ground, wherein the first cascode control circuit is further configured to select one of enabled and disabled of the first beta cascode transistor element based on the one of enabled and disabled of the first beta LNA.

18. The RF receive circuitry of claim 17 wherein:
when the first alpha LNA is enabled using the bias signal via the first alpha input, the first alpha cascode transistor element is configured to be enabled;
when the first beta LNA is enabled using the bias signal via the first beta input, the first beta cascode transistor element is configured to be enabled;
when the first alpha LNA is disabled using the bias signal via the first alpha input, the first alpha cascode transistor element is configured to be disabled; and
when the first beta LNA is disabled using the bias signal via the first beta input, the first beta cascode transistor element is configured to be disabled.

19. Radio Frequency (RF) receive circuitry comprising:
a first output impedance matching circuit;
a second output impedance matching circuit; and
a first dual output RF Low Noise Amplifier (LNA) comprising:
a first alpha LNA coupled to the first output impedance matching circuit via a first alpha output, wherein the first alpha LNA is configured to be one of enabled and disabled based on a first cascode control circuit, such that the first alpha LNA comprises a first alpha cascode transistor element coupled between the first alpha output and a ground; and the first cascode control circuit is configured to use the first alpha cascode transistor element to select the one of enabled and disabled of the first alpha LNA;
a first beta LNA coupled to the second output impedance matching circuit via a first beta output, wherein the first beta LNA is configured to be one of enabled and disabled based on the first cascode control circuit, such that the first beta LNA comprises a first beta cascode transistor element coupled between the first beta output and the ground; and the first cascode control circuit is further configured to use the first beta cascode transistor element to select the one of enabled and disabled of the first beta LNA; and
the first cascode control circuit coupled to a gate of the first alpha cascode transistor element and further coupled to a gate of the first beta cascode transistor element.

20. The RF receive circuitry of claim 19 wherein:
the first alpha LNA further comprises a second alpha cascode transistor element coupled in series with the first alpha cascode transistor element, such that the first cascode control circuit is configured to further use the second alpha cascode transistor element to select the one of enabled and disabled of the first alpha LNA; and
the first beta LNA further comprises a second beta cascode transistor element coupled in series with the first beta cascode transistor element, such that the first cascode control circuit is configured to further use the second beta cascode transistor element to select the one of enabled and disabled of the first beta LNA.

* * * * *